(12) United States Patent
Mayer et al.

(10) Patent No.: US 8,093,579 B2
(45) Date of Patent: Jan. 10, 2012

(54) SEMICONDUCTOR CHIP HAVING A REDUCED BAND OFFSET IN ITS P-DOPED REGION AND METHOD FOR PRODUCING THE SEMICONDUCTOR CHIP

(75) Inventors: Bernd Mayer, Regensburg (DE); Wolfgang Schmid, Deuerling/Hillohe (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 638 days.

(21) Appl. No.: 12/154,552

(22) Filed: May 23, 2008

(65) Prior Publication Data

US 2009/0010290 A1 Jan. 8, 2009

(30) Foreign Application Priority Data

May 23, 2007 (DE) .......................... 10 2007 023 878

(51) Int. Cl.
*H01L 33/00* (2010.01)

(52) U.S. Cl. ............ 257/12; 257/14; 257/200; 257/201; 257/615; 257/E23.023

(58) Field of Classification Search ............... 257/11–14, 257/79, 85, 200–201, 615
See application file for complete search history.

(56) References Cited

U.S. PATENT DOCUMENTS

| | | | |
|---|---|---|---|
| 5,204,284 A | 4/1993 | Kuo et al. | |
| 5,274,656 A | 12/1993 | Yoshida | |
| 5,479,427 A | 12/1995 | Yoshida et al. | |
| 5,619,519 A | 4/1997 | Hamada et al. | |
| 5,714,014 A | 2/1998 | Horikawa | |
| 6,148,013 A * | 11/2000 | Geels et al. | 372/46.01 |
| 2003/0118066 A1 * | 6/2003 | Bour et al. | 372/45 |
| 2005/0271104 A1 | 12/2005 | Ono | |
| 2006/0091421 A1 | 5/2006 | Ono et al. | |
| 2006/0273329 A1 | 12/2006 | Ohta et al. | |

FOREIGN PATENT DOCUMENTS

JP 6-77587 3/1994

OTHER PUBLICATIONS

Mesrine M. et al. "Indium Surface Segregation During Chemical Beam Epitaxy of $Ga_{1-x}In_xAs/GaAs$ and $Ga_{1-x}In_xP/GaAs$ Heterostructures", Journal of Crystal Growth, vol. No. 1, pp. 175-176, May 1997 (8 pages).

* cited by examiner

*Primary Examiner* — Thanh Nguyen
(74) *Attorney, Agent, or Firm* — Cozen O'Connor (57) ABSTRACT

A semiconductor chip (1) comprises a p-doped region (I) having a cladding layer (18) and a contact layer (21) between which a first interlayer (19) and a second interlayer (20) are arranged. A concentration of a first material component (B) within the first and the second interlayer (19, 20) changes in such a way that the band gap varies in a range lying between the band gap of the cladding layer (18) and the band gap of the contact layer (21). A method for producing a semiconductor chip of this type is also disclosed.

31 Claims, 6 Drawing Sheets

SEMICONDUCTOR CHIP HAVING A REDUCED BAND OFFSET IN ITS P-DOPED REGION AND METHOD FOR PRODUCING THE SEMICONDUCTOR CHIP

RELATED APPLICATIONS

This patent application claims the priority of German Patent Application No. 102007023878.0 filed May 23, 2007 the disclosure content of which is hereby incorporated by reference.

FIELD OF THE INVENTION

The invention relates to a semiconductor chip and a method for producing a semiconductor chip of this type.

BACKGROUND OF THE INVENTION

In a conventional InGaAlP-based component produced by means of MOVPE (Metal Organic chemical Vapour Phase Epitaxy), a p-side contact layer can comprise p-doped GaAs. The p-doped GaAs is usually deposited at a temperature that is lower than the production temperature of preceding layers. Cooling to this temperature is typically effected under $PH_3$ supporting pressure. A high charge of $PH_3$ into a reactor chamber which is caused in this way can have adverse consequences for the crystal quality of the further growth on account of the high vapour pressure of phosphorus. Furthermore, a high band offset typically occurs at a transition from the contact layer to a cladding layer. Said band offset is generally reduced by a p-doped interlayer containing InGaP. Nevertheless, stepped barriers can still occur which make hole conduction more difficult (cf. FIG. 7A). This is because although an extent of the barriers can be reduced by means of doping, the height of said barriers cannot be reduced.

The patent Specification U.S. Pat. No. 5,619,519 describes a semiconductor laser component comprising a first cladding layer and a second cladding layer, wherein an interlayer is arranged between the second cladding layer and a covering layer.

SUMMARY OF THE INVENTION

It is an object of the present invention to provide a semiconductor chip having improved electrical properties.

A further object of the present invention is to provide a simplified method for producing a semiconductor chip of this type.

These and other objects are attained in accordance with one aspect of the present invention directed to a semiconductor chip comprising a p-doped region having a cladding layer and a contact layer, wherein a first interlayer and a second interlayer are arranged between the cladding layer and the contact layer, and wherein a concentration y of a first material component within the first and the second interlayer changes in such a way that the band gap within the first and the second interlayer varies in a range lying between the band gap of the cladding layer and the band gap of the contact layer.

An abrupt change in the size of the band gap at the transition from the contact layer to the cladding layer can advantageously be prevented by means of the first and second interlayers. This is because the first and the second interlayer enable a gradual adaptation of the size of the band gap between the contact layer and the cladding layer.

In accordance with one preferred embodiment, the size of the band gap within the first interlayer decreases proceeding from the cladding layer toward the second interlayer. This can be achieved in particular by virtue of the fact that the concentration y of the first material component within the first interlayer decreases proceeding from the cladding layer toward the second interlayer. This configuration has the consequence that the voltage drop in the current flow direction is reduced and the series resistance of the semiconductor chip is significantly smaller than in the case of a conventional semiconductor chip.

Furthermore, the band gap within the second interlayer preferably decreases proceeding from the first interlayer toward the contact layer. Particularly preferably, this is achieved by virtue of the fact that the concentration y of the first material component within the second interlayer decreases proceeding from the first interlayer toward the contact layer. In this case, too, a gradual change in the size of the band gap or in the concentration of the first material component can bring about a reduction of the series resistance of the semiconductor chip.

Preferably, a respective compound semiconductor material is used for the cladding layer, the first interlayer, the second interlayer and the contact layer. Said compound semiconductor material can be a III-V compound semiconductor material, in particular. In accordance with one preferred variant, the compound semiconductor material of the first interlayer is a quaternary compound semiconductor material, in particular a phosphide-based semiconductor material, while the compound semiconductor material of the second interlayer is a ternary compound semiconductor material, in particular an arsenide-based semiconductor material. Furthermore, the cladding layer can comprise a phosphide-based semiconductor material, while the contact layer contains an arsenide-based semiconductor material.

A composition of the respective compound semiconductor material can be described by the following formula: $C_x B_{y(1-x)} E_{(1-y)(1-x)} A$, where $0 \leq x \leq 1$ and $0 \leq y \leq 1$. The letters A, B, C, E stand for the individual material components of which the compound semiconductor material is composed. In this case, this material need not necessarily have a mathematically exact composition according to the above formula. Rather, it can have one or more dopants and additional constituents which essentially do not change the physical properties, in particular the crystal structure or band structure, of the material. By way of example, the first material component (B) can be aluminum, a second material component (E) can be gallium, a third material component (C) can be indium and a fourth material component (A) can be phosphorus or arsenic.

While a change in the concentration y of the first material component and therefore also in the concentration (1-y) of the second material component within the first and second interlayers is provided in the present case, the concentration x of the third material component can be constant in this case. However, it is also conceivable for the concentration x of the third material component to vary. In the context of the invention, the concentration of the first material component and that of the second material component are understood to mean the parameters y and 1-y respectively. It is apparent that the parameter x must also be taken into account for precise calculation of the material composition.

The concentration of the first material component in the cladding layer preferably has a constant value of y=100%. Furthermore, the contact layer can have the second material component in a constant concentration of 1-y=100%. By way of example, the cladding layer can contain InAlP, while the contact layer comprises GaAs.

It is advantageous that by means of a change in the aluminum content in the first and second interlayers the band gap can be varied in a range lying between the band gap of the cladding layer and that of the contact layer. Furthermore, the content of the first material component or the aluminum content at the interface between the first and the second interlayer is preferably chosen in such a way that an energy barrier that has to be surmounted by the holes is comparatively small.

In accordance with one preferred variant, the cladding layer contains InAlP, the first interlayer contains InAlGaP, the second interlayer contains AlGaAs and the contact layer contains GaAs.

In accordance with a further preferred variant, the concentration y of the first material component within the first interlayer, on a side facing the cladding layer, is between 20% and 100% inclusive. In particular, the concentration y can be between 70% and 90% inclusive. Particularly preferably, the concentration y of the first material component within the first interlayer, on a side facing the second interlayer, falls to a value of between 0% and 50% inclusive. In particular, the concentration y of the first material component within the first interlayer, on a side facing the second interlayer, can fall to a value of between 10% and 40% inclusive. Preferably, a valence band has a continuous profile proceeding from the cladding layer towards the contact layer. In particular, the profile of the concentration y of the first material component in a growth direction in which the layers have grown, within the first interlayer, can be like a straight line having a gradient not equal to zero, that is to say that the concentration changes continuously in the growth direction and has a linear profile, in particular. However, a stepped change in the concentration is also conceivable.

In one preferred configuration of the semiconductor chip, the concentration y of the first material component within the second interlayer, on a side facing the first interlayer, is between 10% and 100% inclusive. In particular, the concentration y of the first material component within the second interlayer, on a side facing the first interlayer, can be between 60% and 80% inclusive. Furthermore, the concentration y of the first material component within the second interlayer, on a side facing the contact layer, preferably falls to a value of between 0% and 50% inclusive. In particular, the concentration y of the first material component within the second interlayer, on a side facing the contact layer, can fall to a value of between 2% and 5% inclusive. Here, too, as in the case of the first interlayer, it holds true that the concentration y can decrease continuously, in particular linearly, or in stepped fashion.

The semiconductor chip has, in particular, an active region arranged between the p-doped region and an n-doped region. Preferably, radiation is generated in the active region during operation of the semiconductor chip. Consequently, the semiconductor chip can be referred to as a radiation-emitting semiconductor chip. For generating radiation, the active region preferably comprises a radiation-generating pn junction. In the simplest case, said pn junction can be formed by means of a p-conducting and an n-conducting semiconductor layer that directly adjoin one another. Preferably, the actual radiation-generating layer, for instance in the form of a doped or undoped quantum layer, is formed between the p-conducting and the n-conducting active layer. The quantum layer can be shaped as a single quantum well structure (SQW) or multiple quantum well structure (MQW) or else as a quantum wire or quantum dot structure.

In accordance with one preferred embodiment, the semiconductor chip is a laser diode chip. The semiconductor chip generates coherent radiation in this case. As an alternative, the semiconductor chip can generate incoherent radiation for example in the configuration as a light-emitting diode.

Another aspect of the present invention is directed to a method for producing a semiconductor chip in accordance with one of the variants described above. The method comprises the following steps:
growing the first interlayer onto the cladding layer,
growing the second interlayer onto the first interlayer, and
growing the contact layer onto the second interlayer.

In one preferred variant, the second interlayer is grown onto the first interlayer without any interruption of growth. The production time for the semiconductor chip can advantageously be shortened as a result of this. As an alternative, however, the second interlayer can also be grown onto the first interlayer with interruption of growth.

The semiconductor chip is preferably produced by means of MOVPE.

In accordance with one advantageous variant, between growing the first and the second interlayer, a changeover is made from phosphorus-based growth to arsenic-based growth. In particular, the atmosphere in which the first interlayer is grown is free of arsenic-containing substances. Furthermore, the atmosphere in which the second interlayer is grown is preferably free of phosphorus-containing substances.

The first and the second interlayer can be grown at the same temperature. In this case, the temperature can be approximately 700° C. An interruption of growth preferably takes place after the second interlayer has been grown, the temperature being reduced within said interruption of growth. The interruption of growth can last for a number of minutes.

In contrast to a conventional process, the temperature reduction does not take under phosphine supporting pressure with the disadvantages mentioned at the beginning, but rather under arsine supporting pressure. This has the advantage, firstly, that the semiconductor chip has an improved morphology and, secondly, that a memory effect is significantly suppressed.

In accordance with one preferred configuration, the contact layer is grown after the interruption of growth. This can be carried out at a temperature of approximately 550° C.

As an alternative, a temperature reduction can begin as early as when growing the first and/or second interlayer. This has the advantage that it is possible to dispense with the interruption of growth prior to growing the contact layer, or that the interruption of growth can be shortened.

The p-doped region can be doped by means of various dopants. By way of example, the cladding layer and the first interlayer can be doped with magnesium or zinc. In the present case, carbon as well as zinc or magnesium are particularly suitable as dopants for the second interlayer and the contact layer.

The growth of the second interlayer, which preferably contains AlGaAs, even at high temperatures advantageously enables a sufficiently high incorporation of carbon, magnesium or zinc into the second interlayer. Therefore, the changeover from phosphorus-based growth to arsenic-based growth can take place at high temperatures without any interruption of growth. As a result, the electrical properties of the semiconductor chip can be significantly improved since hole conduction is improved and the series resistance is reduced.

In order to produce a semiconductor chip which has a continuously changing concentration of the first material component in the first and the second interlayer, the concentration of the first material component in the atmosphere is reduced continuously in the course of growing the first and the second interlayer.

DETAILED DESCRIPTION OF THE DRAWINGS

Figure 1:
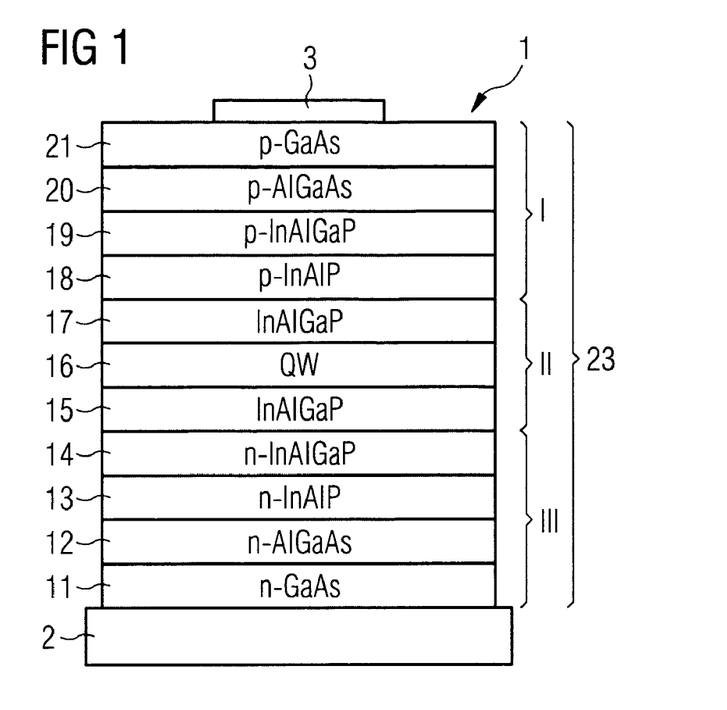
FIG. 1 shows a schematic cross-sectional view of an exemplary embodiment of a semiconductor chip according to the invention.

The semiconductor chip 1 illustrated in FIG. 1 comprises a semiconductor layer sequence 23, which on the rear side is arranged on a carrier 2 and on the front side is provided with a contact metallization 3 for making electrical contact with the semiconductor chip 1. The carrier 2 can be a growth substrate used for growing the layer sequence 23 or alternatively a mounting body to which the layer sequence 23 was applied after production. Furthermore, a further electrical contact can be provided on the carrier 2.

The layer sequence 23 has three different regions, a p-doped region I, an active region II and an n-doped region III.

The p-doped region I comprises a cladding layer 18, a first interlayer 19, a second interlayer 20 and a contact layer 21. The active region II comprises an undoped quantum well layer 16 and barrier layers 15 and 17, which are likewise undoped. Adjacent to the active region II is the n-doped region III, which has a doped barrier layer 14, a cladding layer 13 and also an interlayer 12 and a contact layer 11. Preferred dopants for the n-type doping are silicon and tellurium. Preferably Mg or Zn is used for the p-type doping in the cladding layer 18 and in the first interlayer 19, while preferably C is used for the p-type doping of the second interlayer 20 and of the contact layer 21. It is also possible, however, to use Mg or Zn in the second interlayer 20 and the contact layer 21.

The individual layers of the layer sequence 23 have different thicknesses ranging from a few nanometres to hundreds of nanometres.

In the exemplary embodiment described in the present case, the first material component, the concentration y of which changes within the first interlayer 19 and the second interlayer 20, is aluminum. In particular, the concentration y changes in such a way that the band gap varies in a range lying between the band gap of the cladding layer 19 and the band gap of the contact layer 22. Gallium is preferably used as the second material component, the concentration 1-y of which likewise varies. Indium is present as the third material component having a constant concentration x in the first interlayer 19.

Values for the Al concentration, the Ga concentration, the thickness and the dopant concentration in the individual layers are indicated in the table below:

|  | Al concentration y [%] | Ga concentration 1-y [%] | Thickness [nm] | Dopant concentration [n/cm$^3$] |
|---|---|---|---|---|
| Layer 11 |  |  | 200 | 2.4*10$^{18}$ (Si) |
| Layer 12 | 40 | 60 | 200 | 2.9*10$^{18}$ (Si) |
| Layer 13 | 100 | 0 | 800 | 2.0*10$^{18}$ (Si) |
| Layer 14 | 40 | 60 | 20 | 2.1*10$^{18}$ (Si) |
| Layer 15 | 40 | 60 | 230 |  |
| Layer 16 |  |  | 5 |  |
| Layer 17 | 40 | 60 | 250 |  |
| Layer 18 | 100 | 0 | 800 | 2.9*10$^{17}$ (Mg) |
| Layer 19 | 70 → 20 | 30 → 80 | 20 | 1.1*10$^{17}$ → 2.9*10$^{17}$ (Mg) |
| Layer 20 | 60 → 5 | 40 → 95 | 60 | 3.7*10$^{18}$ → 1.1*10$^{19}$ (C) |
| Layer 21 | 0 | 100 | 400 | 1*10$^{20}$-2*10$^{20}$ (C) |

As emerges from the table, the Al concentration y is at a maximum with 100% in the cladding layer 18, while it assumes a minimum value of 0% in the contact layer 21. In the first interlayer 19, the Al concentration y decreases proceeding from the cladding layer 18 towards the second interlayer 20 from 70% to 20%. The decrease preferably takes place continuously within the first interlayer 19 and does not continue right into the second interlayer 20. Rather, in the second interlayer 20 the Al concentration y starts at a new value that is higher than the final value of the Al concentration y in the first interlayer 19 and is 60% here. In the second interlayer 20 the Al concentration y decreases, preferably continuously, down to a value of 5%.

It is advantageous that by means of the first interlayer 19 and the second interlayer 20 it is possible to reduce a band offset between the cladding layer 18 and the contact layer 21, that is to say the size difference in the band gap between the cladding layer 18 and the contact layer 21, in comparison with a conventional semiconductor chip.

Figure 2:
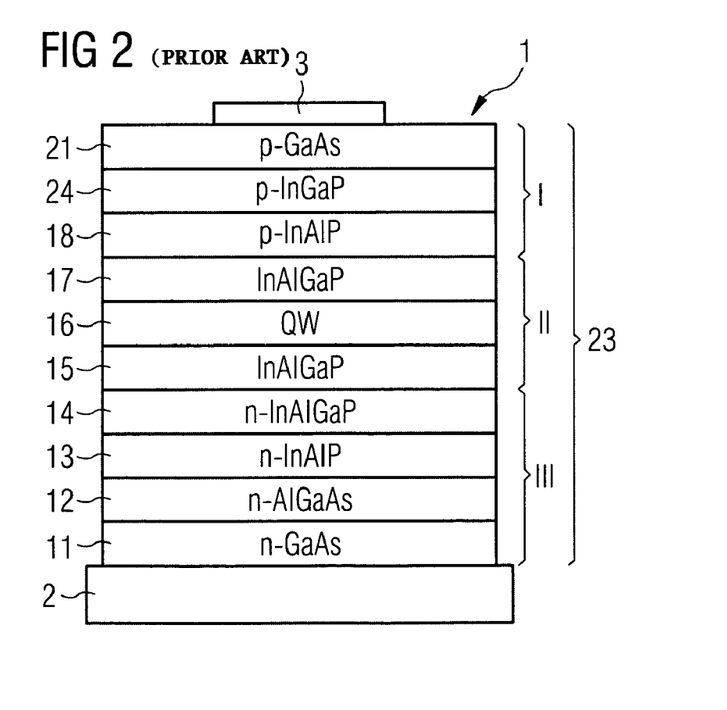
FIG. 2 shows a schematic cross-sectional view of an exemplary embodiment of a conventional semiconductor chip.

FIG. 2 illustrates a conventional semiconductor chip 1 for comparison, said chip having a p-doped interlayer 24 with no Al content instead of the first and the second interlayer.

Figure 3:
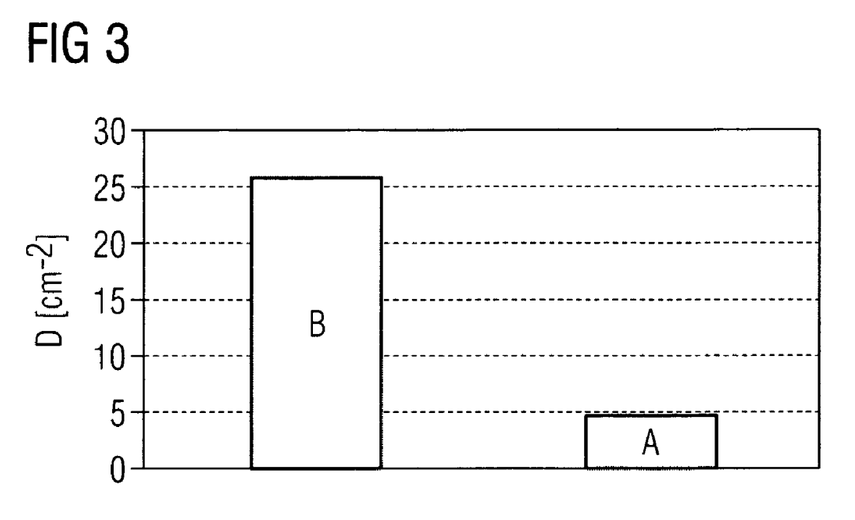
FIG. 3 shows a graph illustrating the defect density D of the semiconductor chip according to the invention and of the conventional semiconductor chip.

FIG. 3 shows a graph with values of the defect density D which occur in the case (A) of the semiconductor chip according to the invention in accordance with the exemplary embodiment illustrated in FIG. 1 and in the case (B) of the conventional semiconductor chip in accordance with the exemplary embodiment illustrated in FIG. 2. As can be discerned, the value in the case of the semiconductor chip illustrated in FIG. 2 (26 cm$^{-2}$) is approximately a factor of 5 higher than in the case of the semiconductor chip in accordance with FIG. 1 (5 cm$^{-2}$). A lower defect density D has the advantage that the lifetime of the semiconductor chip can be increased.

Figure 4:
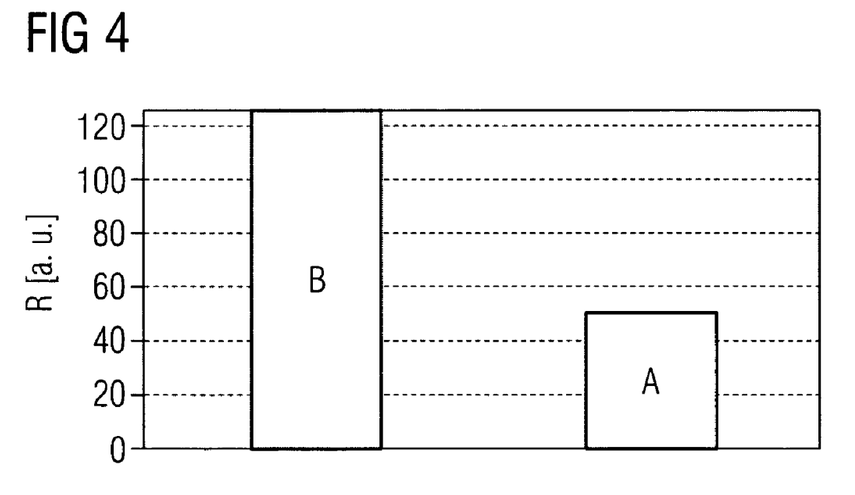
FIG. 4 shows a graph illustrating the roughness R of the semiconductor chip according to the invention and of the conventional semiconductor chip.

The graph of FIG. 4 shows values for the roughness R of a front-side surface of the semiconductor chip in accordance with the exemplary embodiment (A) illustrated in FIG. 1 and of the semiconductor chip in accordance with the exemplary embodiment (B) illustrated in FIG. 2. It is evident from this that the front-side surface of the semiconductor chip in accordance with FIG. 2 is approximately a factor of 2.5 rougher than the front-side surface of the semiconductor chip in accordance with FIG. 1. A reduced roughness R is an indication of an improved crystal quality.

Figure 5:
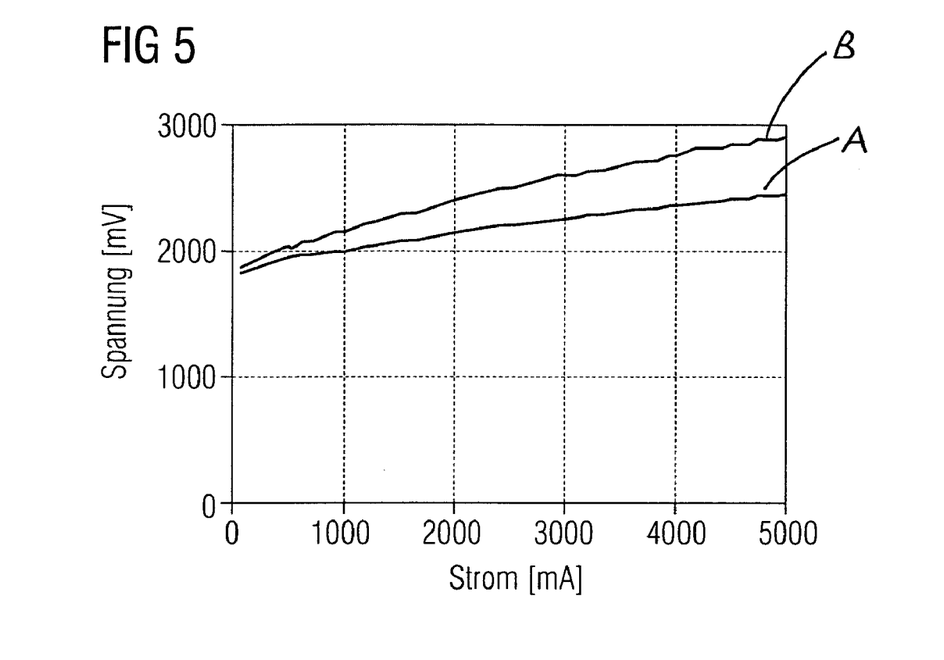
FIG. 5 shows a graph illustrating current-voltage curves of the semiconductor chip according to the invention and of the conventional semiconductor chip.

The graph of FIG. 5 shows current-voltage characteristic curves for the semiconductor chip in accordance with the exemplary embodiment (A) illustrated in FIG. 1 and the semiconductor chip in accordance with the exemplary embodiment (B) illustrated in FIG. 2. A smaller rise in the voltage as the current increases can be noted in the case of the semiconductor chip in accordance with FIG. 1. Consequently, the semiconductor chip in accordance with FIG. 1 requires a lower electrical power for the same optical output power.

Figure 6:
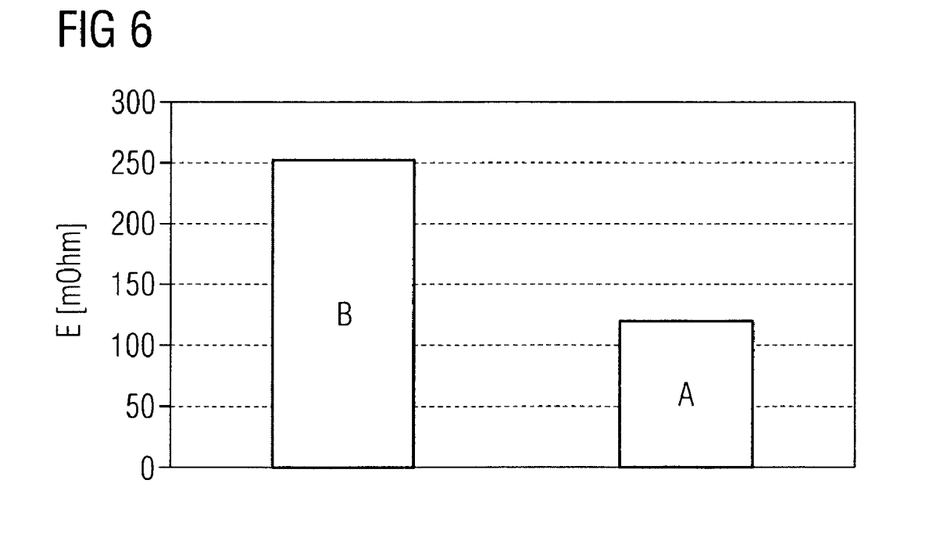
FIG. 6 shows a graph illustrating the electrical resistance E of the semiconductor chip according to the invention and of the conventional semiconductor chip.

The graph of FIG. 6 plots values for the electrical resistance E of the semiconductor chip in accordance with the exemplary embodiment (A) illustrated in FIG. 1 and the semiconductor chip in accordance with the exemplary embodiment (B) illustrated in FIG. 2. From the graph, a value (252 mohms) that is approximately double the value (119 mohms) of the semiconductor chip in accordance with FIG. 1 can be inferred for the semiconductor chip in accordance with FIG. 2. A reduction of the electrical resistance E leads to the reduction, already mentioned in connection with FIG. 5, of the electrical power consumption in the case of the semiconductor chip in accordance with FIG. 1.

Figure 7A:
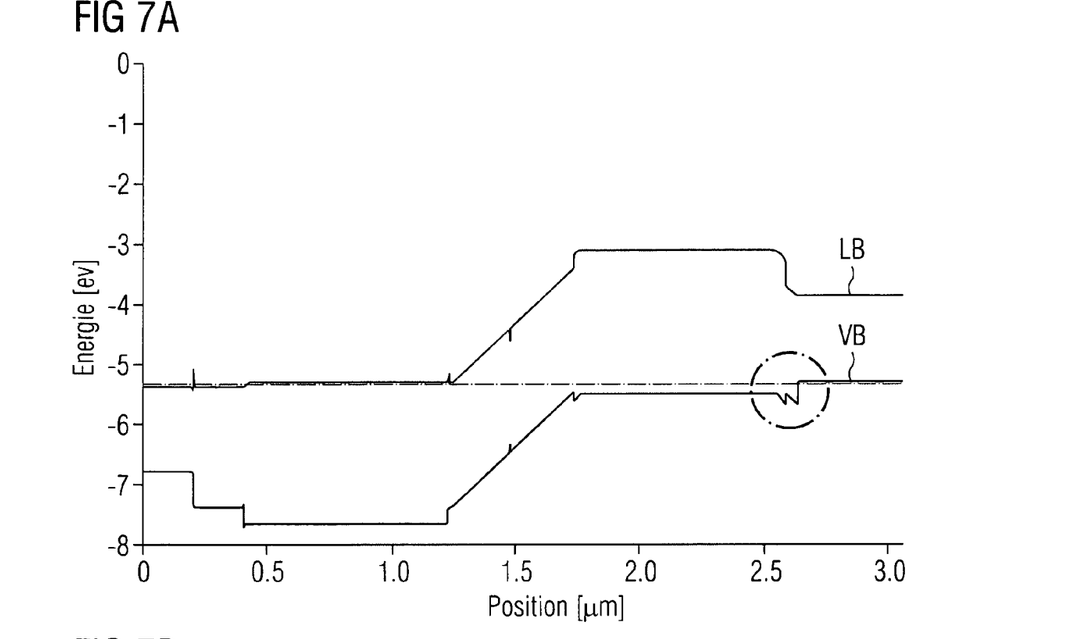
FIGS. 7A and 7B show a graph illustrating a profile of the valence band VB and of the conduction band LB in a conventional semiconductor chip and a semiconductor chip according to the invention.

The graph shown in FIG. 7A illustrates the simulated profile of the valence band VB and of the conduction band LB of a semiconductor chip in accordance with FIG. 2. The encircled location illustrates the problem in the case of a conventional semiconductor chip. "Spikes", representing a barrier for holes, occur in the valence band at the transition between the cladding layer and the contact layer.

Figure 7B:
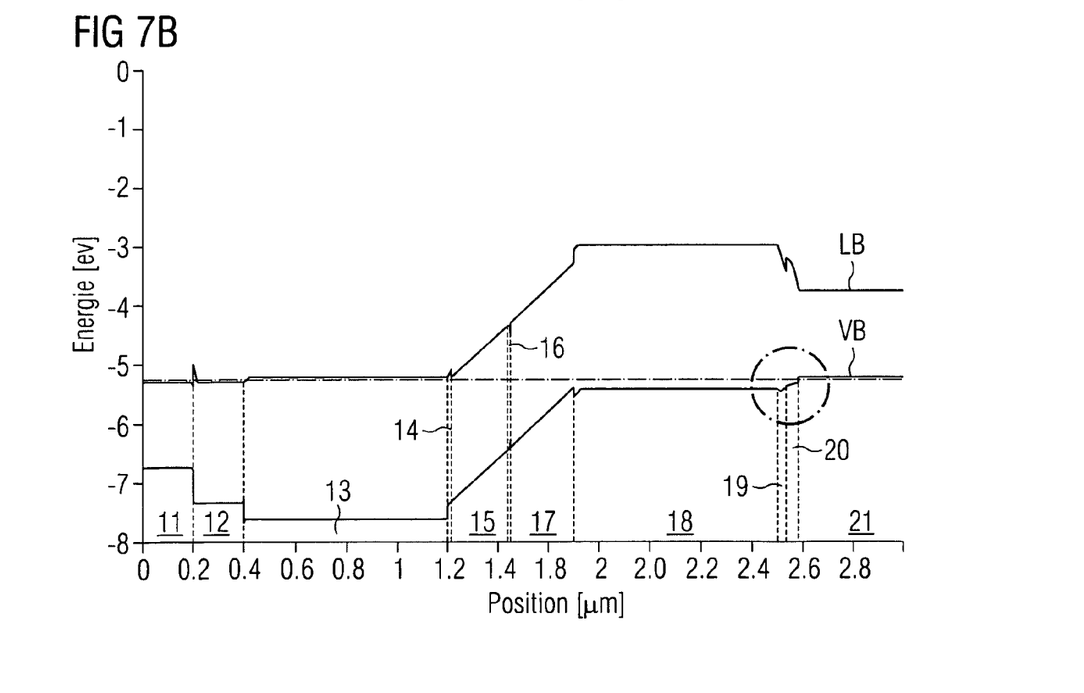

By contrast, an approximately flat profile at the transition between the cladding layer 18 and the contact layer 21 can be inferred in the profile simulated in FIG. 7B of the valence band VB of a semiconductor chip in accordance with FIG. 1. Consequently, the barrier for holes is advantageously obviated in the case of a semiconductor chip as illustrated in FIG. 1.

The epitaxial layers, the production of which is illustrated schematically in FIGS. 8A to 8D, are grown by means of MOVPE.

Figure 8A:
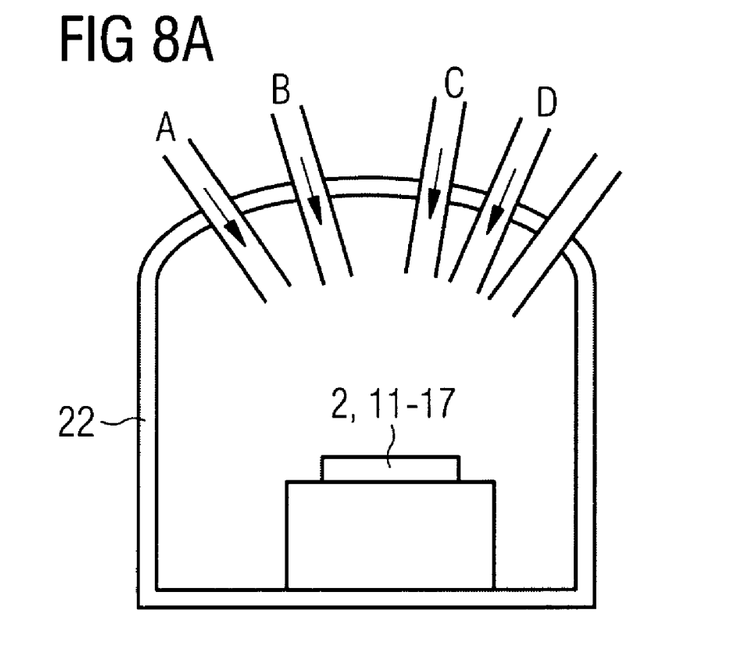
FIGS. 8A to 8D show a schematic illustration of different method steps for producing a semiconductor chip according to the invention.

FIG. 8A shows a production step for growing the p-doped cladding layer (cf. FIG. 1, cladding layer 18). The material components A, B, C and D required for this are introduced in a gaseous state into a reactor chamber 22 through corresponding supply lines. The material component A corresponds to a phosphorus-containing gas, in particular phosphine, the material component B corresponds to an aluminum-containing gas, the material component C corresponds to an indium-containing gas and the material component D corresponds to a first p-type dopant, in particular Mg. The p-doped cladding layer is grown at a temperature of between approximately 700° C. and 800° C. The layers 11 to 17, on which the p-doped cladding layer is deposited, are also produced at said temperature. The resulting p-doped cladding layer has the properties indicated in the table for the layer 18.

Figure 8B:
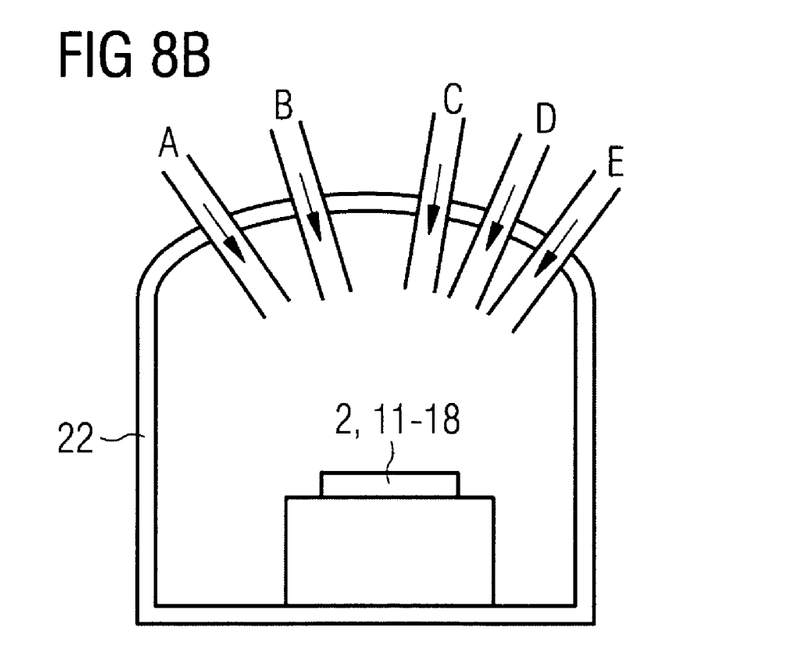

FIG. 8B schematically illustrates a production step for depositing the first interlayer (cf. FIG. 1, first interlayer 19). In this case, a further material component E is supplied, which corresponds to a gallium-containing gas. The growth temperature does not change in comparison with the preceding production step (Figure A). However, the concentration of the material component B, as emerges from the table for the first interlayer 19, continuously decreases. The concentration of the material component E is simultaneously increased. In addition, the concentration of the material component D, that is to say of the p-type dopant, is increased.

Figure 8C:
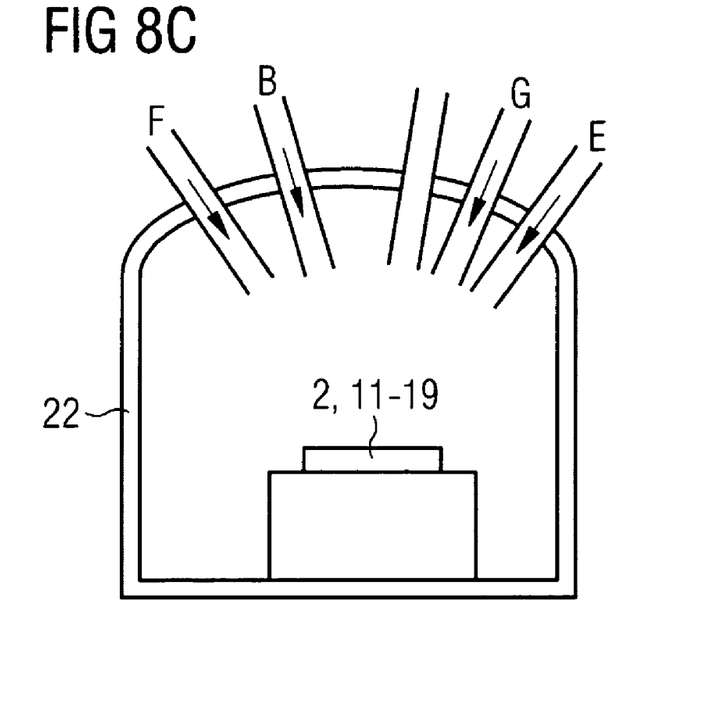

With the temperature remaining the same, the second interlayer (cf. FIG. 1, second interlayer 20) is grown in a next production step, illustrated in FIG. 8C. For this purpose, the material components B and E continue to be introduced into the reactor chamber 22. The material component C is omitted, by contrast. Furthermore, the material component A is replaced by the material component F, which need not necessarily be passed through the same supply line as the material component A. The material component F is an arsenic-containing gas, in particular arsine. Preferably, the changeover from phosphorus-based growth to arsenic-based growth is performed instantaneously, that is to say that the switching off of a phosphorus-containing gas source takes place at the same time as the switching on of an arsenic-containing gas source. In this production step, too, the concentration of the material component B is continuously reduced and the concentration of the material component E is continuously increased (cf. table, second interlayer 20). Instead of the material component D, the material component G is added, which corresponds to a second dopant, in particular carbon. As can be seen from the table, the material component G is continuously increased.

Figure 8D:
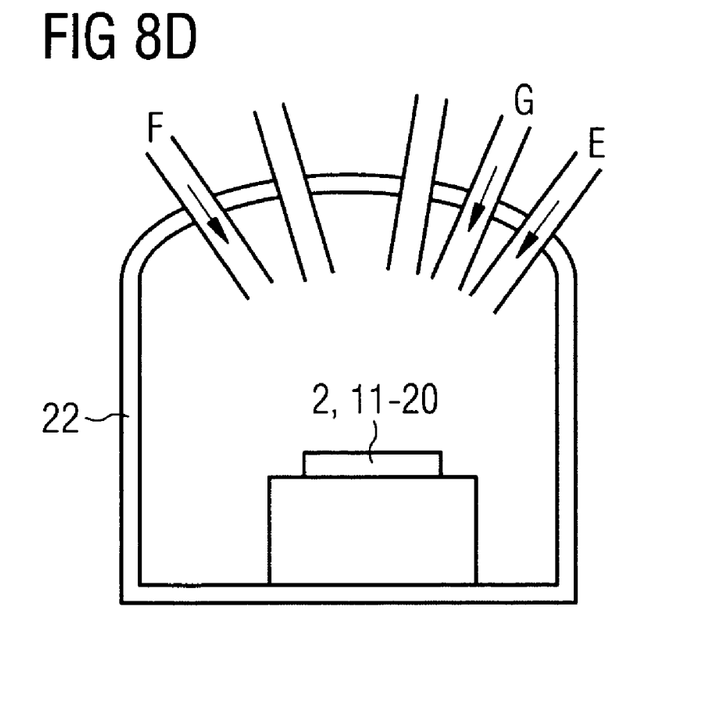

A growth pause, lasting a few minutes, of preferably 3 min to 5 min is introduced between the production steps illustrated in FIG. 8C and FIG. 8D. In said growth pause, the temperature is reduced to approximately 540° C., which is preferably done under arsine supporting pressure. At said temperature, the p-doped contact layer (cf. FIG. 1, contact layer 21) is then grown from the material components G and E and p-doped with the material component F. More detailed information in this respect can be found in the table.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. A semiconductor chip comprising a p-doped region having a cladding layer and a contact layer, a first interlayer and a second interlayer being arranged between the cladding layer and the contact layer, and wherein a concentration y of a first material component within the first and the second interlayer changes such that a band gap within the first and the second interlayer varies in a range lying between a band gap of the cladding layer and the band gap of the contact layer, the cladding layer, the first interlayer, the second interlayer and the contact layer each containing a respective compound semiconductor material, a composition of the each respective compound being in accordance with the relationship:

$$C_x B_{y(1-x)} E_{(1-y)(1-x)} A, \text{ where } 0 \leq x \leq 1 \text{ and } 0 \leq y \leq 1;$$

wherein B is a first material component, E is a second material component, C is a third material component and A is a fourth material component;

wherein the concentration y of the first material component within the first interlayer decreases in an order proceeding from the cladding layer towards the second interlayer and the concentration y of the first material component within the second interlayer decreases in an order proceeding from the first interlayer towards the contact layer; and wherein the concentration y of the first material component starts in the second interlayer at a value that is higher than a final value of the concentration y in the first interlayer.

2. The semiconductor chip according to claim 1, wherein a size of the band gap within the first interlayer decreases in an order proceeding from the cladding layer toward the second interlayer.

3. The semiconductor chip according to claim 1, wherein the band gap within the second interlayer decreases in an order proceeding from the first interlayer toward the contact layer.

4. The semiconductor chip according to claim 1, wherein the first material component is aluminum.

5. The semiconductor chip according to claim 1, wherein the second material component is gallium.

6. The semiconductor chip according to claim 1, wherein the fourth material component is phosphorus or arsenic.

7. The semiconductor chip according to claim 1, wherein the cladding layer contains InAlP, the first interlayer contains InAlGaP, the second interlayer contains AlGaAs and the contact layer contains GaAs.

8. The semiconductor chip according to claim 1, wherein the concentration y of the first material component within the first interlayer, on a side facing the cladding layer, is between 20% and 100% inclusive.

9. The semiconductor chip according to claim 8, wherein the concentration y of the first material component within the first interlayer, on a side facing the cladding layer, is between 70% and 90% inclusive.

10. The semiconductor chip according to claim 1, wherein the concentration y of the first material component within the first interlayer, on a side facing the second interlayer is between 0% and 50% inclusive.

11. The semiconductor chip according to claim 10, wherein the concentration y of the first material component within the first interlayer, on a side facing the second interlayer is between 10% and 40% inclusive.

12. The semiconductor chip according to claim 1, wherein the concentration y of the first material component within the second interlayer, on a side facing the first interlayer, is between 10% and 100% inclusive.

13. The semiconductor chip according to claim 12, wherein the concentration y of the first material component within the second interlayer, on a side facing the first interlayer, is between 60% and 80% inclusive.

14. The semiconductor chip according to claim 1, wherein the concentration y of the first material component within the second interlayer, on a side facing the contact layer, is between 0% and 50% inclusive.

15. The semiconductor chip according to claim 14, wherein the concentration y of the first material component within the second interlayer, on a side facing the contact layer, is between 2% and 5% inclusive.

16. The semiconductor chip according to claim 1, wherein a valence band extends continuously proceeding from the cladding layer towards the contact layer.

17. The semiconductor chip according to claim 1, wherein the semiconductor chip has an active region arranged between the p-doped region and an n-doped region.

18. The semiconductor chip according to claim 1, wherein the semiconductor chip is a laser diode chip.

19. A method for producing a semiconductor chip according to claim 1, comprising the steps of:
growing the first interlayer onto the cladding layer;
growing the second interlayer onto the first interlayer; and
growing the contact layer onto the second interlayer.

20. The method according to claim 19, wherein the second interlayer is grown onto the first interlayer without any interruption of growth.

21. The method according to claim 19, wherein between growing the first and the second interlayer, a changeover is made from phosphorus-based growth to arsenic-based growth.

22. The method according to claim 21, wherein the first and the second interlayer are grown at the same temperature.

23. The method according to claim 22, wherein the temperature is approximately 700° C.

24. The method according to claim 22, wherein an interruption of growth takes place after the second interlayer has been grown, the temperature being reduced within said interruption of growth.

25. The method according to claim 24, wherein the temperature is reduced under arsine supporting pressure.

26. The method according to claim 24, wherein the contact layer is grown at a temperature of approximately 550°.

27. The method according to claim 19, wherein the first interlayer is doped with magnesium or zinc.

28. The method according to claim 19, wherein the second interlayer is doped with carbon, magnesium or zinc.

29. The method according to claim 19, wherein the concentration of the first material component is reduced continuously in the course of growing the first and the second interlayer.

30. A semiconductor chip comprising a p-doped region having a cladding layer and a contact layer, a first interlayer and a second interlayer being arranged between the cladding layer and the contact layer, and a concentration y of a first material component within the first and second interlayers changing such that a band gap within the first and second interlayers varies in a range lying between a band gap of the cladding layer and a band gap of the contact layer, the first material component being Al; wherein a concentration y of the first material component Al decreases proceeding in an order from the cladding layer towards the contact layer and changes discontinuously at a transition between the first and second interlayers.

31. A semiconductor chip comprising a p-doped region having a cladding layer and a contact layer, a first interlayer and a second interlayer being arranged between the cladding layer and the contact layer, and wherein a concentration y of a first material component within the first and the second interlayer changes such that a band gap within the first and the second interlayer varies in a range lying between a band gap of the cladding layer and the band gap of the contact layer, the cladding layer, the first interlayer, the second interlayer and the contact layer each containing a respective compound semiconductor material, a composition of the each respective compound being in accordance with the relationship:

$$C_xB_{y(1-x)}E_{(1-y)(1-x)}A, \text{ where } 0 \leq x \leq 1 \text{ and } 0 \leq y \leq 1;$$

wherein B is a first material component, E is a second material component, C is a third material component and A is a fourth material component;

wherein the concentration y of the first material component within the first interlayer decreases in an order proceeding from the cladding layer towards the second interlayer and the concentration y of the first material component within the second interlayer decreases in an order proceeding from the first interlayer towards the contact layer;

wherein the concentration y of the first material component starts in the second interlayer at a value that is higher than a final value of the concentration y in the first interlayer; and wherein the third material component is indium.

* * * * *